(12) United States Patent
Kuo

(10) Patent No.: US 7,016,233 B2
(45) Date of Patent: Mar. 21, 2006

(54) WORDLINE DECODER AND MEMORY DEVICE

(75) Inventor: Cheng-Hsiung Kuo, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/847,106

(22) Filed: May 17, 2004

(65) Prior Publication Data

US 2005/0254331 A1   Nov. 17, 2005

(51) Int. Cl.
*G11C 16/06* (2006.01)

(52) U.S. Cl. .......................... 365/185.23; 365/185.18; 365/185.24

(58) Field of Classification Search ........... 365/185.23, 365/185.18, 185.24, 185.29, 230.03
See application file for complete search history.

(56) References Cited

U.S. PATENT DOCUMENTS

| | | | | |
|---|---|---|---|---|
| 4,858,194 A | * | 8/1989 | Terada et al. ........... | 365/185.25 |
| 5,566,109 A | * | 10/1996 | Matsubara ............. | 365/185.08 |
| 6,151,254 A | * | 11/2000 | Kanamori .............. | 365/185.29 |
| 6,754,131 B1 | * | 6/2004 | Kirsch et al. .......... | 365/230.06 |

* cited by examiner

*Primary Examiner*—Gene N. Auduong
(74) *Attorney, Agent, or Firm*—Thomas, Kayden, Horstemeyer & Risley

(57) ABSTRACT

A wordline decoder for a memory device drives a word line of a memory array and comprises a first circuit, a second circuit, and a buffer circuit. The first circuit receives voltage from a first voltage source. The second circuit receives voltage from a second voltage source. During an erase cycle, the buffer circuit receives a third voltage higher than the second voltage and lower than the first voltage. During read and program cycles, the buffer circuit receives a fourth voltage substantially equal to the first and second voltage.

20 Claims, 6 Drawing Sheets

WORDLINE DECODER AND MEMORY DEVICE

FIELD OF THE INVENTION

The present invention relates to a wordline decoder, and in particular to a wordline decoder employed in a memory device.

DESCRIPTION OF THE RELATED ART

FIG. 1 is a basic schematic diagram of a flash semiconductor memory device. The memory device comprises a plurality of flash memory cells and other components, such as a wordline decoder and a bitline decoder. The flash memory cells are disposed in an array, such as memory array 10. Each flash memory cell (labeled as "$10_1$" in FIG. 1) has a memory transistor storing a logic level of "1" or "0". When receiving a row address signal, a wordline decoder 11 enables one of the word lines $WL1_0$ to $WL1_n$ to select flash memory cells in the corresponding row. When receiving a column address signal, a bitline decoder 12 enables one of the bit lines to select the flash memory cells in the corresponding column. According to the row address signal and the column address signal, a selected flash memory cell can execute read, program and erase operations.

FIG. 2 is a schematic diagram of the wordline decoder 11. The wordline decoder 11 comprises a plurality of wordline decoding units $11_0$ to $11_n$. For example, wordline decoding unit $11_0$ corresponds to the word lines $WL1_0$. A typical voltage supplied from voltage source VDD is 2.5V (for 0.25 um technology, VDD is 2.5V). The typical voltages supplied from voltage source ZVDD are 2.5V during program and read cycles and 13.5V during the erase cycle. As shown in FIG. 2, the NMOS transistors N11 and N13 are turned on, as the gates thereof are both coupled to the voltage source VDD. Moreover, the unselected word lines are coupled to ground GND (0V).

During the erase cycle, and when the word line $WL1_0$ is selected, a voltage level of a selection signal $SEL1_0$ goes high, and an NMOS transistor N10 turns on while a PMOS transistor P10 turns off. Consequently, a voltage level at a node NO11 goes low. Since the NMOS transistor N11 is turned on, a voltage level at a node NO12 is low, and a PMOS transistor P12 is turned on so that a voltage level of the word line $WL1_0$ changes from 0V to 2.5V, that is, from the low voltage level to the high voltage level. When the word line $WL1_0$ is enabled to execute an erase operation, the voltage level of the word line $WL1_0$ changes from 2.5V to 13.5V. At this time, since the NMOS transistor N13 is turned on, a voltage level of a node NO13 is 2.0V (i.e., 2.5V–0.5V) due to the 0.5V threshold voltage of the NMOS transistor N13.

During the erase cycle, and when the word line $WL1_0$ is not selected, the voltage level of the selection signal $SEL1_0$ changes to low. The NMOS transistor N10 turns off and the PMOS transistor P10 turns on. Consequently, the voltage level of the node NO11 goes high. Since a gate of an NMOS transistor N12 is coupled to the node NO11, the NMOS transistor N12 turns on, and the voltage levels at a node NO13 and the word line $WL1_0$ both go low. A PMOS transistor P11 turns on because its gate is coupled to the word line $WL1_0$. At this time, the voltage level of the node NO12 is 13.5V, and the voltage level of the node NO11 is 2.0V (i.e., 2.5V–0.5V) due to the 0.5V threshold voltage of the NMOS transistor N11.

The operation described above is applicable to the 0.25 $\mu$m fabrication process. Unfortunately, this is not so for low power, or advanced technology, such as 0.18 $\mu$m, 0.15 $\mu$m, or 0.13 $\mu$m fabrication processes. The reason being that the voltage supplied from the voltage source VDD is lower than 2.5V. Consequently, the NMOS transistors N11 and N13, which isolate the high voltage during the erase cycle, malfunction.

Typically, the voltage supplied from the voltage source VDD is 1.2V, and the voltage supplied from the voltage source ZVDD is 13.5V for 0.18 $\mu$m, 0.15 $\mu$m, or 0.13 $\mu$m fabrication processes. When the word line $WL1_0$ begins executing the erase operation during the erase cycle, the voltage level of the word line $WL1_0$ is 13.5V, and the voltage level of the node NO13 is 0.7V (i.e., 1.2V–0.5V). Therefore, the voltage level of the word line $WL1_0$ cannot maintain 13.5V and back-end devices malfunction. Reliability of the NMOS transistor N13 is decreased due to a large voltage (12.8V=13.5V–0.7V) difference between its drain and its source. Similarly, when the word line $WL1_0$ is not selected during the erase cycle, the voltage levels of nodes NO11 and NO12 are 0.7V (i.e., 1.2V–0.5V) and 13.5V, respectively. Reliability of the NMOS transistor N13 is decreased due to a large voltage (12.8V=13.5V–0.7V) difference between its drain and its source. That is, the NMOS transistors N11 and N13 suffer high voltage stress during the erase period, thus resulting in damage of devices and reduced product life.

SUMMARY

Accordingly, one object, among others, of the present invention is to provide a wordline decoder for a flash memory device to enhance reliability.

According to the object described above, an embodiment of the present invention provides a wordline decoder for a memory device to drive a word line of a memory array. The wordline decoder comprises a first circuit, a second circuit, a buffer circuit, and a voltage pumping device. The first circuit receives voltage from a first voltage source and has a first node and a second node connected to the word line. Logic levels of the first and second nodes are inverse to each other. The second circuit receives voltage from a second voltage source and a selection signal corresponding to the word line. The first circuit receives voltage from a first voltage source. The second circuit receives voltage from a second voltage source. During an erase cycle, the buffer circuit receives a third voltage higher than the second voltage and lower than the first voltage. During read and program cycles, the buffer circuit receives a fourth voltage substantially equal to the first and second voltage.

A detailed description is given in the following embodiments with reference to the accompanying drawings.

BRIEF DESCRIPTION OF THE DRAWINGS

Various aspects of the present invention can be more fully understood by reading the subsequent detailed description and examples with references made to the accompanying drawings, wherein.

DETAILED DESCRIPTION

Figure 1:
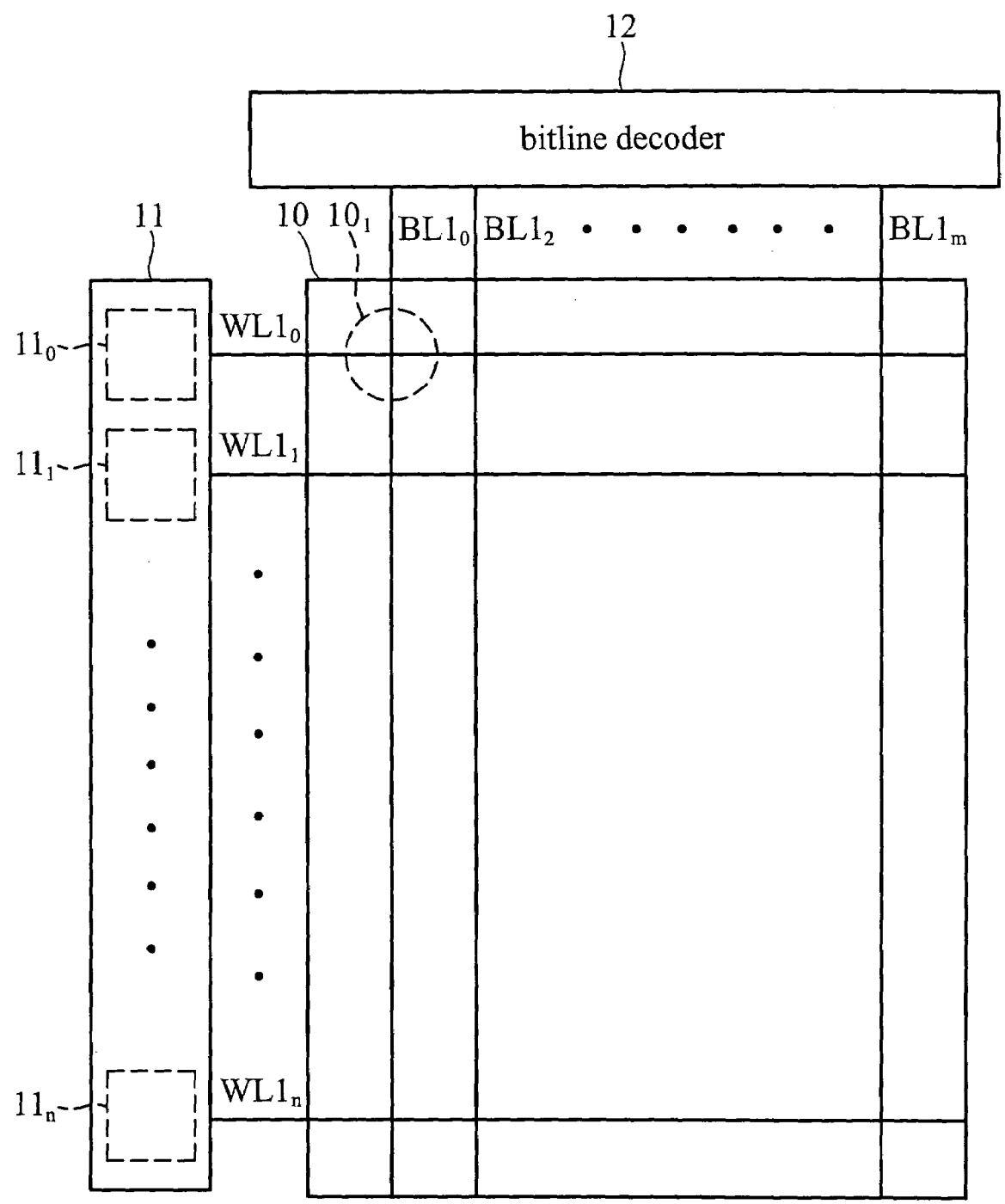
FIG. 1 is a basic schematic diagram of a flash semiconductor memory device.
Figure 2:
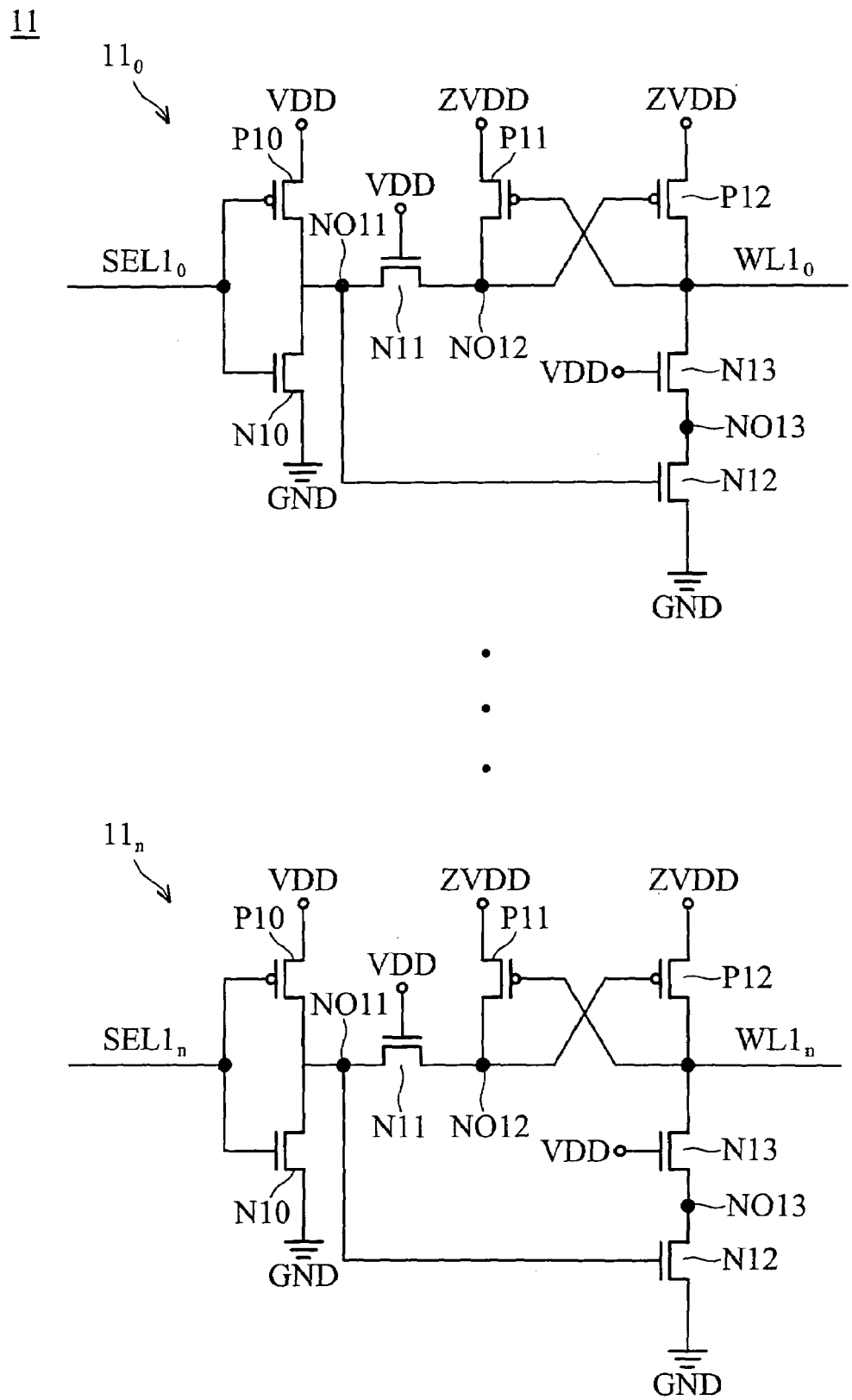
FIG. 2 is a schematic diagram of the wordline decoder of FIG. 1.
Figure 3:
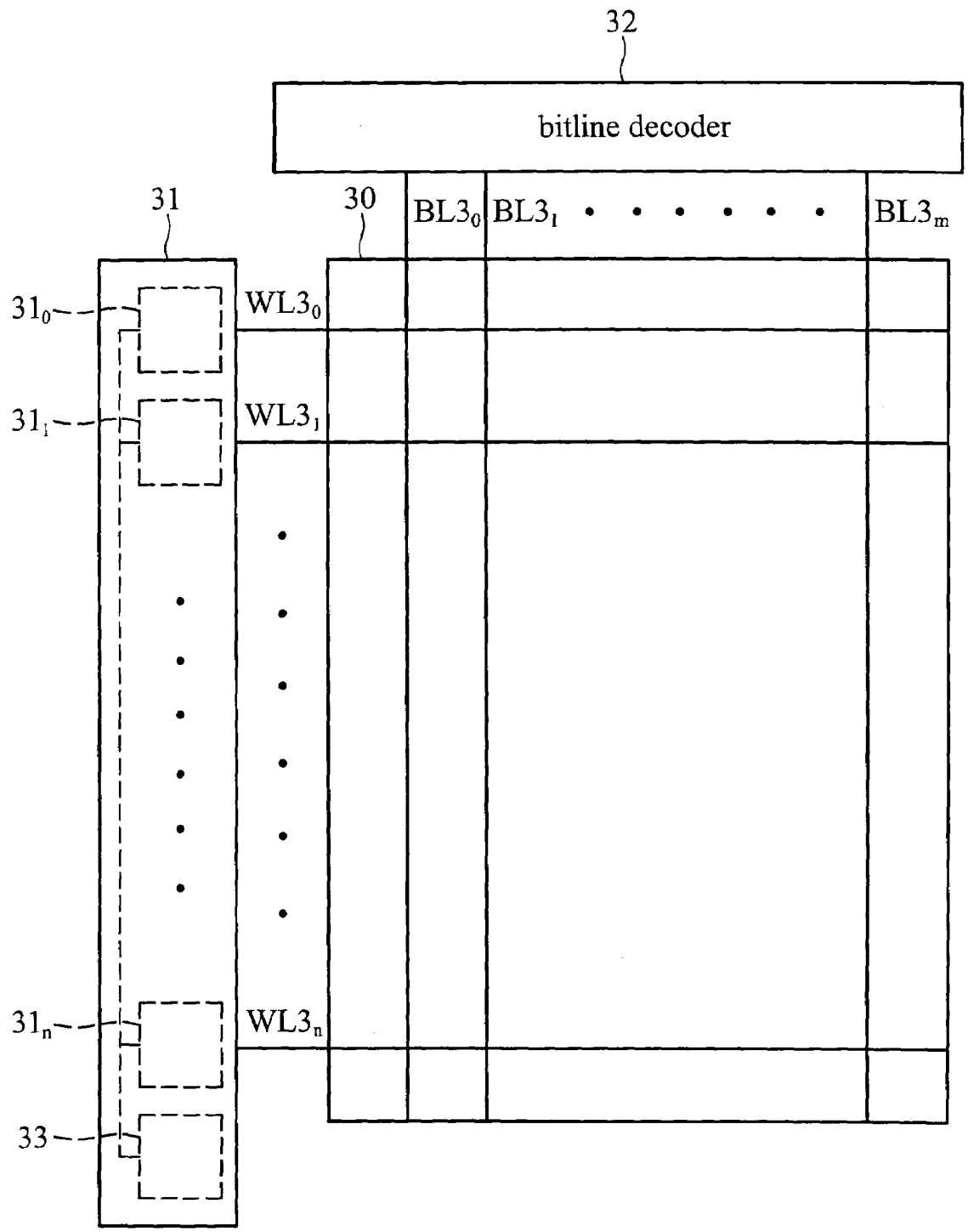
FIG. 3 is a schematic diagram of a flash memory device in accordance with an embodiment of the present invention.

FIG. 3 is a schematic diagram of a flash memory device in accordance with one embodiment of the present invention. The flash memory device 3 comprises a memory array 30, a wordline decoder 31, and a bitline decoder 32. The wordline decoder 31 controls a plurality of word lines $WL3_0$ to $WL3_n$, and the bitline decoder 32 controls a plurality of bit lines $BL3_0$ to $BL3_m$. One flash memory cell of the memory array 30 can be selected by controlling the wordline decoder 31 and the bitline decoder 32.

The wordline decoder 31 comprises a voltage pumping device 33 and a plurality of wordline decoding units $31_0$ to $31_n$. The wordline decoding unit $31_0$ is given as an example in one embodiment of the present invention.

Figure 4:
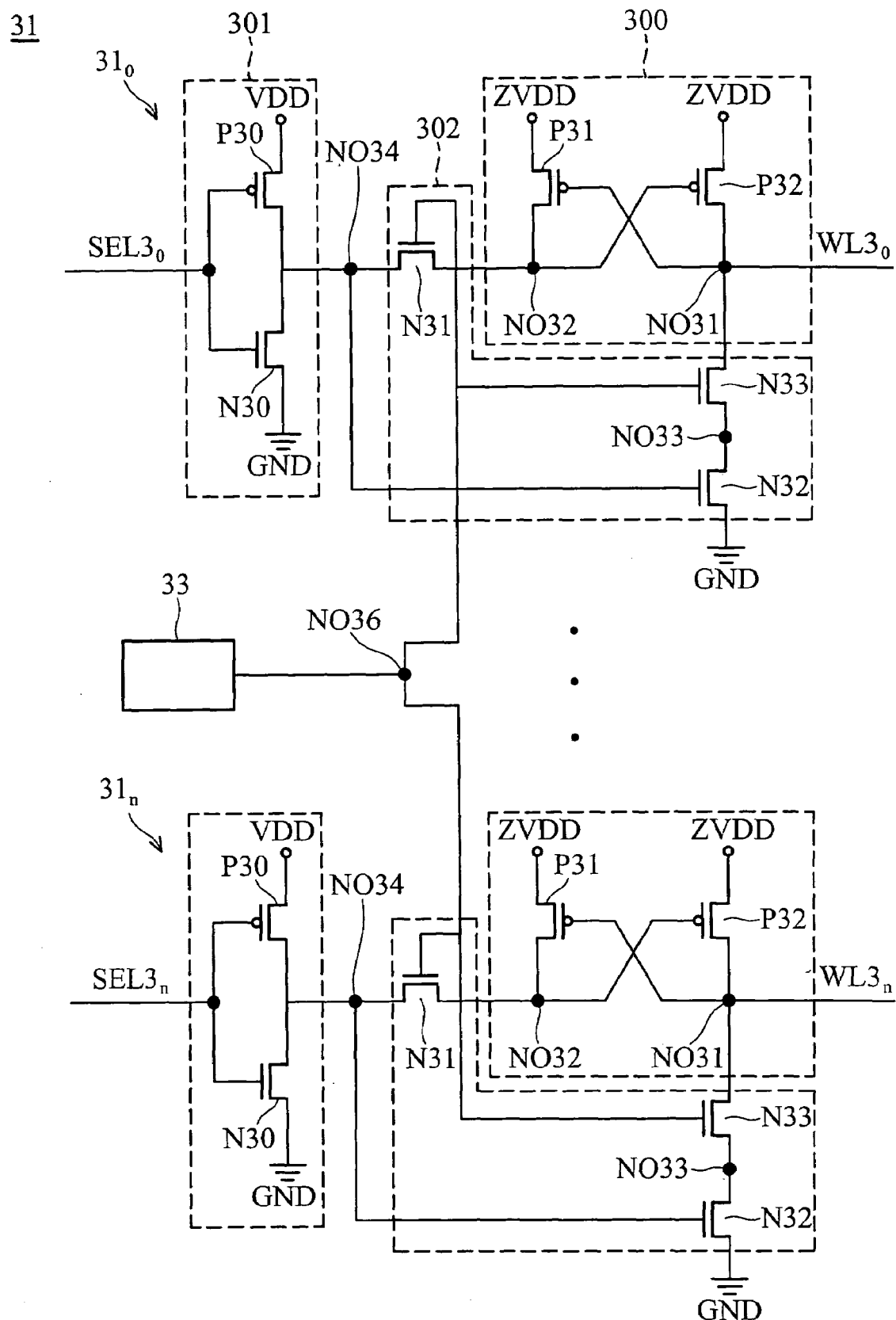
FIG. 4 is a schematic diagram of the wordline decoder in an embodiment of the present invention.

Referring to FIG. 4, the wordline decoding unit $31_0$ corresponds to the word line $WL3_0$ and comprises a first circuit 300, a second circuit 301, and a buffer circuit 302.

The first circuit 300 has PMOS transistors P31 and P32. A gate of the PMOS transistor P31 is coupled to a drain of the PMOS transistor P32 at a node NO31, and a source of the PMOS transistor P31 is coupled to the voltage source ZVDD. A gate of the PMOS transistor P32 is coupled to a drain of the PMOS transistor P31 at the node NO32, and a source of the PMOS transistor P32 is coupled to the voltage source ZVDD. The node NO31 is connected to the word line $WL3_0$. The logic level of the nodes NO31 and NO32 are inverse to each other.

The second circuit 301 has an NMOS transistor N30 and a PMOS transistor P30. A source of the PMOS transistor P30 is coupled to the voltage source VDD and a source of the NMOS transistor N30 is coupled to the ground GND. Gates of the transistors N30 and P30 receive the selection signal $SEL3_0$, and drains of the transistors N30 and P30 are coupled to the node NO34.

The buffer circuit 302 has NMOS transistors N31, N32, and N33. A source of the NMOS transistor N31 is coupled to the first circuit 300 at the node NO32. A drain of the NMOS transistor N33 is coupled to the first circuit at the node NO31 and a source of the NMOS transistor N33 is coupled to a drain of the NMOS transistor N32 at the node NO33. A source of the NMOS transistor N32 is coupled the ground GND. A drain of the NMOS transistor N31 and a gate of the NMOS transistor N32 are coupled to the second circuit 301 at the node NO34. Gates of the NMOS transistors N31 and N33 are coupled to the voltage pumping device 33.

In some embodiments of the present invention, the voltage level of VDD is 1.2V. The voltage supplied from the voltage source ZVDD is 1.2V during program and read cycles and 13.5V during the erase cycle.

Referring to FIG. 4, during the erase cycle, when the word line $WL3_0$ is selected, a voltage level of the selection signal $SEL3_0$ goes high so that the NMOS transistor N30 turns on and the PMOS transistor P30 turns off. Consequently, a voltage level of the node NO34 goes low. The voltage pumping device 33 supplies 2.5V to the gates of the NMOS transistors N31 and N33 to turn on the NMOS transistors N31 and N33. The voltage level at the node NO32 is low and the PMOS transistor P32 turns on. The voltage level of the word line $WL3_0$ changes from 0V to 1.2V, that is from a low voltage level to a high voltage level. When the word line $WL3_0$ begins the erase operation, the voltage from the voltage source ZVDD changes from 1.2V to 13.5V. The voltage level of the node NO33 is 2V (2.5V–0.5V) due to the 0.5V threshold voltage of the NMOS transistor N33.

During the erase cycle and when the word line $WL3_0$ is not selected, the voltage-level of the selection signal $SEL3_0$ changes to low, and the NMOS transistor N30 turns off while the PMOS transistor P30 turns on. Consequently, the voltage level of the node NO34 goes high. The voltage pumping device 33 supplies 2.5V to the gates of the NMOS transistors N31 and N33 to turn on the NMOS transistors N31 and N33. The voltage level of the word line $WL3_0$ goes low and the PMOS transistor P31 turns on. Therefore, the voltage of the node NO32 is 13.5V and the voltage level of the node NO34 is 2V (2.5V–0.5V) due to the 0.5V threshold voltage of the NMOS transistor N31.

As described above, during the erase cycle and when the word line $WL3_0$ begins executing the erase operation, the voltage level of node NO33 is higher than that of the node NO13 in the related art. Thus, a voltage difference between the word line $WL3_0$ and the node NO33 decreases so that the voltage level of the word line $WL3_0$ can be stably maintained at 13.5V. Additionally, the voltage level between the drain and the source of the NMOS transistor N33 is 11.5V (13.5–2V) lower than that of the NMOS transistor N13 of the related art, offering enhanced reliability. During the erase cycle and when the word line $WL3_0$ is not selected, the voltage level of the node NO34 is 2V and that of the node NO32 is 13.5V. Thus, the voltage level between the drain and the source of the NMOS transistor N31 decreases, and reliability of the NMOS transistor N31 is maintained.

During program and read cycles, the voltage pumping device 33 supplies voltage signal VS31 of 1.2V to the gates of the NMOS transistors N31 and N33.

Figure 5:
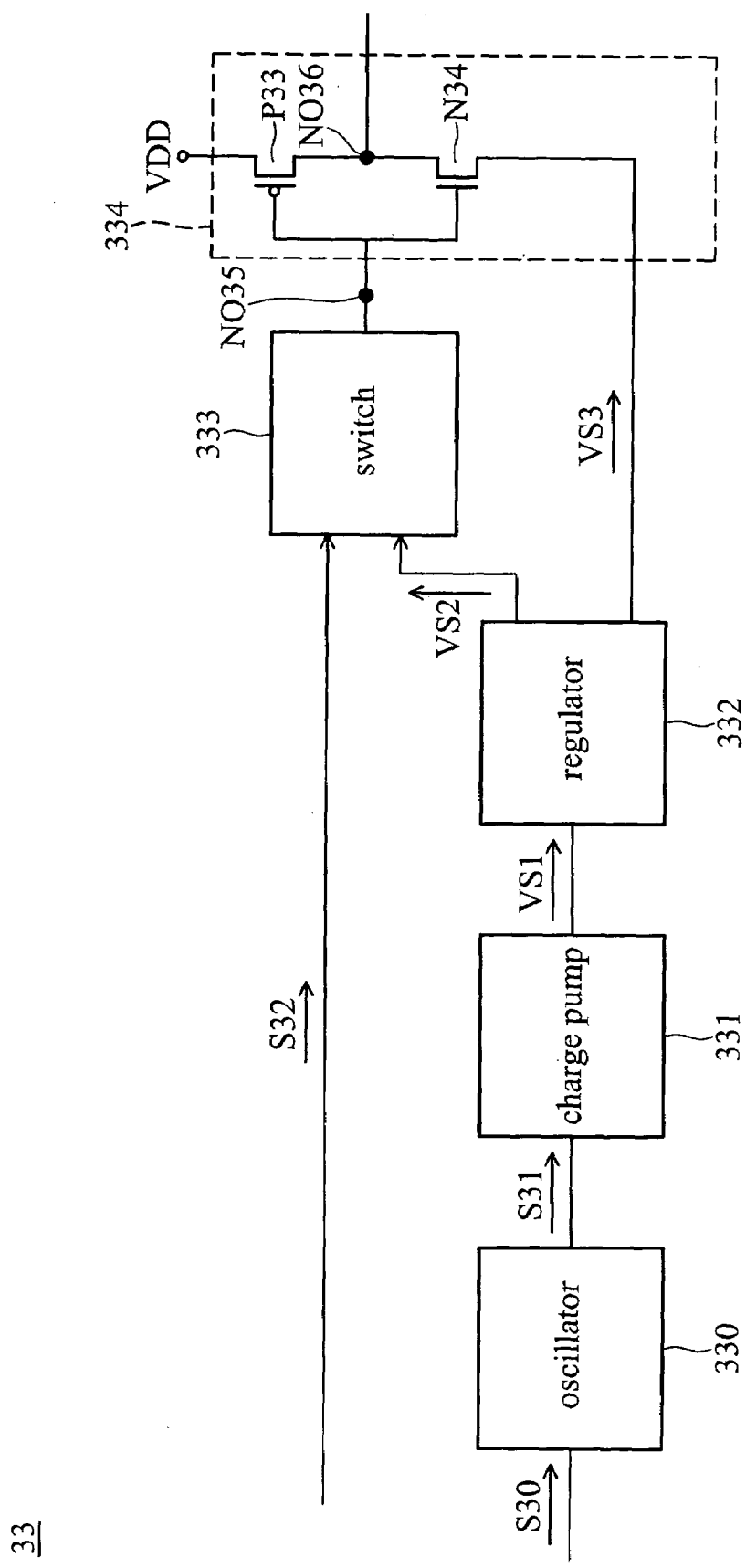
FIG. 5 is a schematic diagram of the voltage pumping device in an embodiment of the present invention.

FIG. 5 is a schematic diagram of the voltage pumping device 33 in accordance with one embodiment of the present invention. The voltage pumping device 33 receives an erase signal S30 to control the voltage level of the gates of the NMOS transistors N31 and N33. The voltage pumping device 33 comprises an oscillator 330, a charge pump 331, a regulator 332, a switch 333, and a third circuit 334. The third circuit 334 has an NMOS transistor N34 and a PMOS transistor P33. A source of the PMOS. transistor P33 is coupled to the voltage source VDD, and a source of the NMOS transistor N34 is coupled to the regulator 322. Gates of the transistors P33 and N34 are coupled to the switch 333 at the node N35. Drains of the transistors P33 and N34 are coupled to the gates of the NMOS transistors N31 and N22 at a node NO36.

Figure 6:
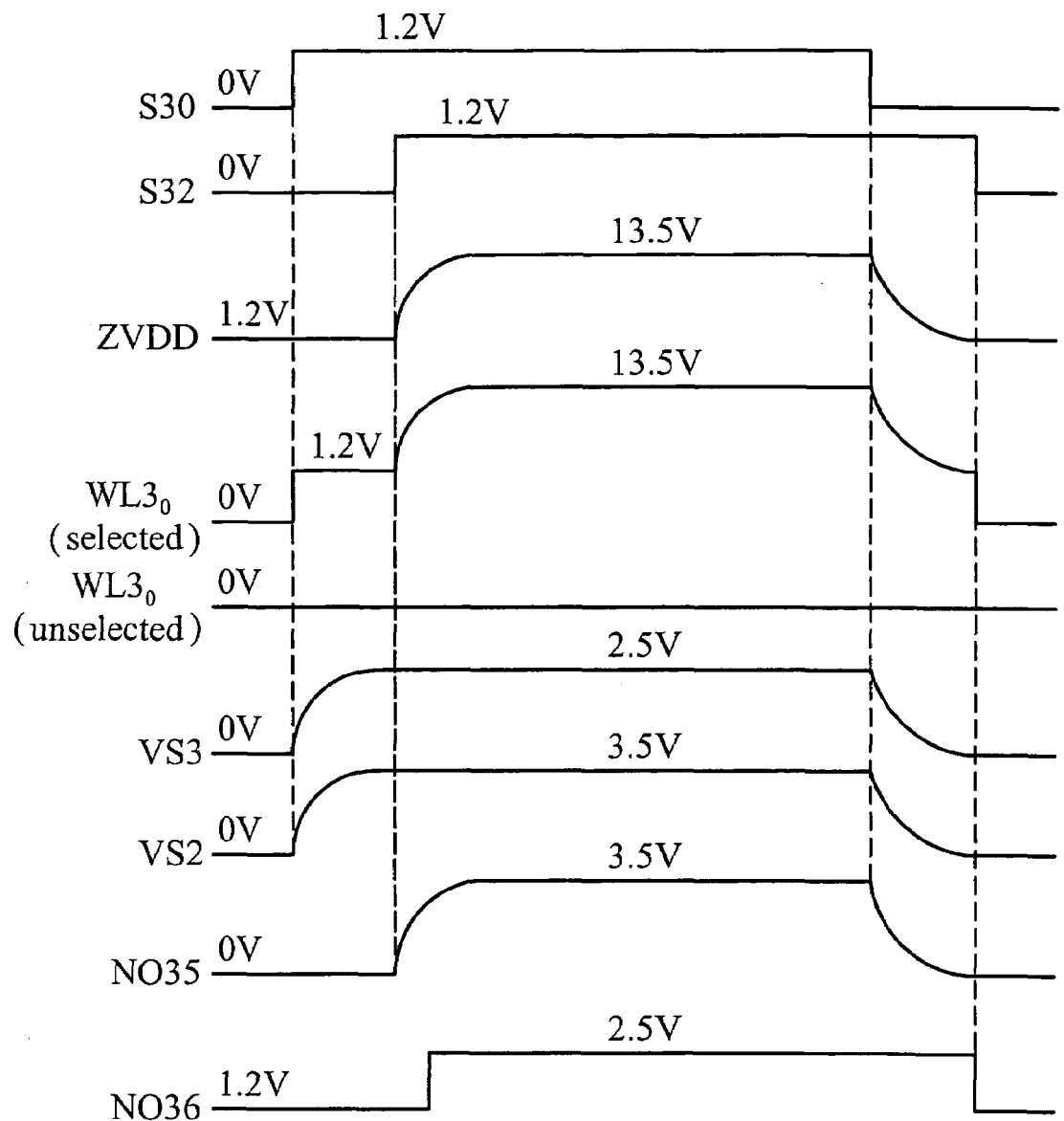
FIG. 6 is a timing chart of the wordline decoder in an embodiment of the present invention.

FIG. 6 is a timing chart of the wordline decoder 31 of the present invention. Referring to FIGS. 5 and 6, during an erase cycle, the oscillator 330 receives the erase signal S30 and outputs a clock signal S31 to the oscillator. The charge pump 331 generates a pumping voltage signal VS1 according to the clock signal S31. The regulator 332 outputs a voltage signal VS2 (typically 3.5V) to the switch 333, and a voltage signal VS3 (typically 2.5V) to the source of the NMOS transistor N34 according to the pumping voltage signal VS1. The switch 333, coupled to the regulator 332, receives the voltage signal VS2. When receiving the start signal S32 with a high voltage level, the switch 333 provides the voltage signal VS2 to the node NO35. The transistor N34 is turned on and the transistor P22 is turned off so that the third circuit 334 provides 2.5V to the gates of NMOS transistors N31 and N32.

During program and read cycles, the switch 333 provides a low level voltage to the node NO35. The voltage level of the node NO36 is 1.2V.

According to the wordline decoder 31, the word line WL3$_0$ can stably maintain on a constant voltage level by controlling the voltage provided to the buffer circuit 302. Moreover, the drain-source voltage of the NMOS transistors N31 and N33, which isolate the high voltage during the erase cycle, decreases. Concurrently, the flash memory device operates normally for 0.18 µm, 0.15 µm, or 0.13 µm fabrication processes.

While several embodiments of the invention have been described by way of example, it is to be understood that the invention is not limited to the disclosed embodiments. To the contrary, it is intended that various modifications and similar arrangements (as would be apparent to those skilled in the art) be covered.

What is claimed is:

1. A wordline decoder for a memory device to drive a word line of a memory array, the wordline decoder comprising:
    a first circuit receiving voltage from a first voltage source, the first circuit having a first node and a second node, wherein logic levels of the first and second nodes are inverse to each other, the second node being connected to the word line;
    a second circuit receiving voltage from a second voltage source, the second circuit further receiving a selection signal corresponding to the word line; and
    a buffer circuit coupled between the first node and the second circuit;
    wherein, during an erase cycle, the buffer circuit receives a third voltage higher than the second voltage and lower than the first voltage, and the first, second, and third voltages are positive.

2. The wordline decoder as claimed in claim 1, wherein, during read and program cycles, the buffer circuit receives a fourth voltage substantially equal to the first and second voltage.

3. The wordline decoder as claimed in claim 1, wherein the buffer circuit comprises:
    a first transistor whose two source/drain terminals respectively coupled to the first node and the second circuit;
    a second transistor whose two source/drain terminals respectively coupled to a third node and the second node; and
    a third transistor whose two source/drain terminals respectively coupled to the third node and a ground and gate terminal coupled to the second circuit.

4. The wordline decoder as claimed in claim 1 farther comprising a voltage pumping device providing the third voltage to the buffer circuit.

5. The wordline decoder as claimed in claim 4, wherein the voltage pumping device comprises:
    an oscillator receiving an erase signal during the erase cycle, the oscillator outputting a clock signal during the erase cycle;
    a charge pump coupled to the oscillator, the charge pump outputting a pumping voltage signal according to the clock signal;
    a regulator coupled to the charge pump, the regulator outputting the third voltage and a fifth voltage according to the pumping voltage signal, wherein the fifth voltage is higher than the third voltage;
    a switch coupled to the regulator, the switch receiving the fifth voltage, the switch outputting the fifth voltage according to a start signal; and
    a third circuit coupled to the switch and the regulator, the third circuit being controlled by the fifth voltage, wherein, when the switch receives the start signal, the third circuit receives the fifth voltage and provides the third voltage to the buffer circuit.

6. The wordline decoder as claimed in claim 5, wherein, during the read and program cycles, the third circuit provides the fourth voltage to the buffer circuit.

7. The wordline decoder as claimed in claim 5, wherein the third circuit comprises:
    a fourth transistor whose two source/drain terminals are coupled to the second voltage source and a fourth node, respectively;
    a fifth transistor whose two source/drain terminals are coupled to the fourth node and the third voltage, respectively;
    wherein gate terminals of the fourth and fifth transistors receive the fifth voltage; and
    wherein the fourth node is coupled to the buffer circuit.

8. The wordline decoder as claimed in claim 7, wherein the fourth and fifth transistors are a PMOS transistor and an NMOS transistor, respectively.

9. The wordline decoder as claimed in claim 1, wherein the first circuit comprises:
    a sixth transistor whose two source/drain terminals are coupled to the first voltage source and the second node, respectively; and
    a seventh transistor whose two source/drain terminals are coupled to the first voltage source and the first node, respectively.

10. The wordline decoder as claimed in claim 9, wherein the sixth and seventh transistors are PMOS transistors.

11. The wordline decoder as claimed in claim 1, wherein the second circuit comprises:
    an eight transistor whose two source/drain terminals are coupled to the second voltage source and a fifth node, respectively;
    a ninth transistor whose two source/dram terminals are coupled to the fifth node and ground;
    wherein gate terminals of the eighth and ninth transistor receive the selection signal; and
    wherein the fifth node is coupled to the buffer circuit.

12. The wordline decoder as claimed in claim 11, wherein the eighth and ninth transistors are a PMOS transistor and an NMOS transistor, respectively.

13. A memory device, comprising:
    a plurality of word lines;
    a plurality of bit lines;
    a memory array having a plurality of memory cells arranged in a matrix;
    a bitline decoder selecting the memory cells in a column through the corresponding bit line according to a column address signal; and
    a wordline decoder selecting the memory cells in a row through the corresponding word line according a row address signal;
    wherein each word line is controlled by a decoding unit of the wordline decoder;
    wherein the decoding unit comprises:
        a first circuit receiving voltage from a first voltage source, the first circuit having a first node and a second node, wherein logic levels of the first and second nodes are inverse to each other, the second node being connected to the word line;
        a second circuit receiving voltage from a second voltage source, the second circuit further receiving a selection signal corresponding to the word line; and
        a buffer circuit coupled between the first node and the second circuit;

wherein, during an erase cycle, the buffer circuit receives a third voltage higher than the second voltage and lower than the first voltage, and the first, second, and third voltages are positive.

14. The memory device as claimed in claim 13, wherein, during read and program cycles, the buffer circuit receives a fourth voltage substantially equal to the first and second voltage.

15. The memory device as claimed in claim 13 further comprising a voltage pumping device providing the third voltage to the buffer circuit.

16. The memory device as claimed in claim 15, wherein the voltage pumping device comprises:
- an oscillator receiving a erase signal during the erase cycle, the oscillator outputting a clock signal during the erase cycle;
- a charge pump coupled to the oscillator, the charge pump outputting a pumping voltage signal according to the clock signal;
- a regulator coupled to the charge pump, the regulator outputting the third voltage and a fifth voltage according to the pumping voltage signal, wherein the fifth voltage is higher than the third voltage;
- a switch coupled to the regulator, the switch receiving the fifth voltage, the switch outputting the fifth voltage according to a start signal;
- a third circuit coupled to the switch and the regulator, the third circuit controlled by the fifth voltage; and
- wherein, when the switch receives the start signal, the third circuit receives the fifth voltage and provides the buffer circuit.

17. In a memory device having bit lines, the memory device further having word lines, the memory device further having bitline decoders, the memory device further having wordline decoders, each wordline decoder being coupled to a first voltage and a second voltage, a method comprising the steps of:
- coupling each wordline decoder to a third voltage; and
- controlling the voltage at the output of each wordline decoder by selectively varying the third voltage, wherein the first, second, and third voltages are positive.

18. In a memory device having bit lines, the memory device further having word lines, the memory device further having bitline decoders, the memory device further having wordline decoders, each wordline decoder being coupled to a first voltage, each wordline decoder further being coupled to a second voltage, a mechanism for controlling the output of each wordline decoder, the mechanism comprising:
- means for receiving a third voltage; and
- means for adjusting an output voltage using the received third voltage, wherein the first, second, and third voltages are positive.

19. The method as claimed in claim 17, wherein during an erase cycle, the third voltage is higher than the second voltage and lower than the first voltage.

20. The mechanism as claimed in claim 18, wherein during an erase cycle, the third voltage is higher than the second voltage and lower than the first voltage.

* * * * *